United States Patent
Moss et al.

(10) Patent No.: US 8,066,560 B2
(45) Date of Patent: Nov. 29, 2011

(54) SYSTEM AND METHOD FOR INFORMATION HANDLING SYSTEM FLOOR TILE COOLING AIRFLOW MEASUREMENT

(75) Inventors: David L. Moss, Austin, TX (US); Shawn Hoss, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 1655 days.

(21) Appl. No.: 11/031,805

(22) Filed: Jan. 7, 2005

(65) Prior Publication Data

US 2006/0172692 A1 Aug. 3, 2006

(51) Int. Cl.
F24F 7/00 (2006.01)
(52) U.S. Cl. .................................... 454/264; 137/512.5
(58) Field of Classification Search ............ 138/45; 229/117.06; 454/186, 239, 290, 264
See application file for complete search history.

(56) References Cited

U.S. PATENT DOCUMENTS

| | | | | |
|---|---|---|---|---|
| 3,425,443 A | * | 2/1969 | Smith | 137/512.15 |
| 4,058,100 A | * | 11/1977 | Tanaka et al. | 123/457 |
| 4,231,253 A | * | 11/1980 | Ohnhaus et al. | 73/861.62 |
| 4,754,651 A | | 7/1988 | Shortridge et al. | 73/861.42 |
| 4,807,667 A | * | 2/1989 | Ohnhaus | 138/45 |
| 5,372,544 A | * | 12/1994 | Gervais | 454/256 |
| 5,565,630 A | * | 10/1996 | Shene | 73/861.53 |
| 6,178,655 B1 | * | 1/2001 | Potter et al. | 33/668 |
| 2001/0032873 A1 | * | 10/2001 | Grueneberg | 229/117.06 |
| 2004/0231347 A1 | * | 11/2004 | Kim et al. | 62/183 |

OTHER PUBLICATIONS

Endecon Engineering, "A Guide to Photovoltaic (PV) System Design and Installation", Jun. 2001, http://www.solargenerations.com/downloads/PVInstallGuideV0108.pdf.*

* cited by examiner

*Primary Examiner* — Steven B McAllister
*Assistant Examiner* — Samantha Miller
(74) *Attorney, Agent, or Firm* — Hamilton & Terrile, LLP; Robert W. Holland

(57) ABSTRACT

External airflow rates from floor vents that provide chilled air to information handling systems are measured with a disposable tool to ensure compatibility of the information handling systems' external air cooling constraints with the cooling capacity of the floor vents. For instance, an information handling system manufacturer sends a disposable tool formed from a cardboard box to a user location. The tool has an open bottom to fit over a floor vent and a slat cut in a side surface to move in response to airflow that enters at the bottom. Pre-calibrated markings associated with expected airflow rates for information handling system cooling floor vents measure airflow rates by the degree of slat movement so that the user location and manufacturer may confer to confirm the compatibility of the user location cooling capacity with selected information handling systems.

16 Claims, 4 Drawing Sheets

SYSTEM AND METHOD FOR INFORMATION HANDLING SYSTEM FLOOR TILE COOLING AIRFLOW MEASUREMENT

BACKGROUND OF THE INVENTION

1. Field of the Invention

The present invention relates in general to the field of information handling system cooling, and more particularly to a system and method for information handling system floor tile cooling airflow measurement.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are sometimes grouped in relatively small areas, such as in support of network functions. For example, information technology or data centers typically have server rooms which house multiple information handling systems in one or more server racks. A typical server rack stands several feet tall and has information handling systems vertically stacked from the floor level to the top level. Indeed, information handling system manufacturers generally attempt to design data centers to have a desired information handling capacity in a minimal footprint. However, large concentrations of information handling systems in relatively small areas generally results in heat build-up that decreases system performance and, if excessive, leads to system failure. In order to counteract this heat build-up, information technology or data centers typically provided a cooling airflow into server rooms to cool the information handling systems and remove excess heat. Air conditioning systems are purchased to provide a desired degree of cooling according to the number and type of deployed information handling systems. The cooling airflow is usually routed through ducts deployed in a raised floor that supports the information handling systems. The ducts output the cooling airflow through floor tiles located proximate information handling systems. Ideally, the cooling airflow has a great enough flow rate so that chilled air reaches information handling systems located in the upper portion of a server rack.

One difficulty that arises with the delivery of chilled air to information handling systems is the distribution of the chilled air through multiple floor vents. Imbalanced delivery of cooling airflow introduces the risk of damage to information handling systems through overheating where airflow is deficient and increases cooling expense where systems receive excessive cooling airflow. In order to ensure adequate and balanced cooling airflow, measurements are typically taken at each of the floor vents and adjustments made as necessary to achieve a desired cooling airflow at each floor vent. Typical cooling airflow rates vary from 100 to 700 cubic feet per minute (CFM) with an average of approximately 400 CFM. The airflow at a selected floor vent is measured with a number of types of devices, such as a hood that fits over the entire vent or a propeller-driven hand held device that is manually inserted in the airflow coming from a selected vent. However, these measuring devices tend to be expensive and complex. For instance, a floor hood device used to measure airflow in the HVAC industry tends to cause backpressure at the vent, which reduces the cooling airflow so that complex computations are often needed to determine the actual airflow of the vent when unimpeded by the hood device. Manual measurements with handheld devices typically require multiple samples at different locations of a vent and subsequent extrapolation to approximate the flow rate. Other devices, such as hot wire anemometers, are also available but tend to involve the same types of complexity and expense. Thus, the task of managing flow rates from floor vents is often beyond the skill set of typical information technology administrators.

SUMMARY OF THE INVENTION

Therefore a need has arisen for a system and method which measures information handling system floor vent cooling airflow with reduced complexity and expense.

In accordance with the present invention, a system and method are provided which substantially reduce the disadvantages and problems associated with previous methods and systems for measuring information handling system floor vent cooling airflow. A disposable airflow measurement tool determines the airflow rate from a floor vent to determine whether cooling constraints of information handling systems placed proximate the floor vent are met.

More specifically, a user at a user location provides chilled air from floor vents for cooling information handling systems located proximate the floor vents. The user places an order with a manufacturer for one or more information handling systems having cooling constraints met by external chilled air. The manufacturer sends a disposable airflow rate measuring tool to the user location so that the user may confirm that the available airflow rate from a floor vent will meet the cooling constraints of the information handling system placed proximate the floor vent at a desired height. In one embodiment, the disposable tool is a cardboard or plastic box that fits over the floor vent to accept the airflow and has movable element to measure the airflow by the degree of movement. For example, a slat cut in the side of the box swings from a closed position to an open position at a hinged portion with the degree of movement of the slat determined by a restricting device. Markings on the restricting device provide airflow rate measurements based on the amount of movement. In an alternative embodiment, weighted devices having varying weight and aerodynamic characteristics are placed in a floor vent airflow to measure the rate of airflow based on the movement of the weighted device in response to the airflow. The airflow rate measurements are returned from the user location to the manufacturer to compare available airflow with information handling system cooling constraints for confirmation of the compatibility of selected information handling systems with positions within the user location.

The present invention provides a number of important technical advantages. One example of an important technical advantage is that information handling system floor vent cooling airflow is measured in an inexpensive and simple manner to aid in adequate distribution of chilled air to multiple information handling systems distributed across multiple floor vents. Simplified measurements achieved with tools designed around measuring flow rates associated with information handling system floor vents encourages information technology administrators to consider cooling constraints in the selection and purchase of information handling systems. Measurement of cooling airflow rates with a disposable tool provided by an information handling system manufacturer improves information the technology administrator information handling system purchasing experience. The disposable tool imposes minimal cost and adds the convenience of direct consultations with the manufacturer about cooling constraints before purchase without the disruption of an outside vendor taking airflow measurements in sensitive areas.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Disposable airflow rate measuring tools deploy to information handling system user locations to determine the compatibility of floor vent cooling capacity with information handling systems intended for use at the location. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
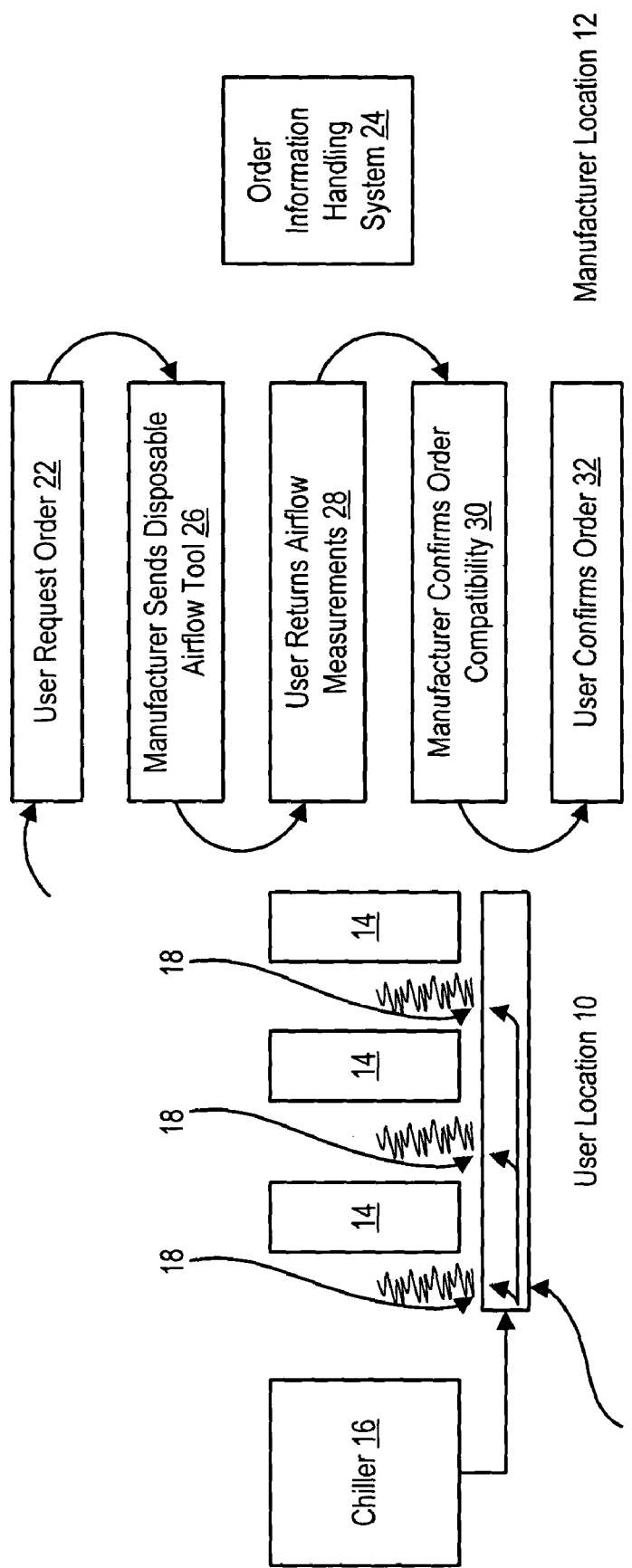
FIG. 1 depicts a functional block diagram of a system for ordering information handling systems having floor vent cooling airflow constraints.

Referring now to FIG. 1, a functional block diagram depicts a system for supporting the ordering of information handling systems for a user location 10 having floor vent cooling from an information handling system manufacturer location 12. User location 10 has plural information handling systems 14 that receive chilled air from a chiller 16 through floor vents 18 fed by ducts routed through a raised floor 20. Information handling systems 14 have heat-producing components disposed through their vertical height. For instance, each information handling system 14 is a server rack having plural vertically stacked information handling system units, such as blades in a blade server. The rate of airflow from floor vents 18 has to provide sufficient chilled air to heat-producing components in the vertically-raised portions of information handling systems 14 so that the components operate properly and do not overheat. Since air provided by chiller 16 is distributed at relatively low pressures, uneven distribution of chilled air across plural floor vents 18 may be caused by small disruptions to the airflow through raised floor 20. Thus, the rate of flow of chilled air through a floor vent 18 determines whether and how high information handling system components may safely be placed proximate to the floor vent so that enough chilled air from the floor vent reaches the components to meet their cooling constraints.

In the functional block diagram depicted by FIG. 1, a user at step 22 who is associated with user location 10 sends a request for an order for information handling systems to the manufacturer location 12, such as through an Internet-supported order information handling system 24. The requested order is identified by order information handling system 24 as associated with an information handling system that receives chilled air through floor vents, such as by a user input or by identifying server information handling systems typically used in a data center environment. At step 26, the information handling system manufacturer sends a disposable airflow measuring tool to the user at the user location so that user is able to self-measure the airflow rate that proceeds from each of the floor vents 18. The cost of the airflow measuring tool is reduced by using a simple mechanical design that need only be effective within the range of airflow rates expected from a floor vent used to provide chilled air to information handling systems. For instance, typical airflow rates range from 100 to 700 CFM with average rates of approximately 400 CFM. The simple mechanical design is made of disposable materials, such as plastic or cardboard, so that the user may discard the tool after use.

Airflow rates from floor vents 18 that are measured by the disposable airflow measuring tool are returned to order information handling system 24 for analysis at step 28. The measured airflow rates are applied against information handling system cooling constraints to determine whether selected information handling systems are compatible with available cooling capacity in the user location, such at particular heights proximate particular floor vents. In alternative embodiments, the application of measured airflow rates to information handling system cooling constraints may be performed at the user location by the downloading of instructions from order information handling system 24 to a locally operating information handling system, such as by population of a spreadsheet with the measured airflow rates. At step 30, the compatibility of ordered information handling systems is confirmed or denied for selected positions within user location 10. For instance, information handling systems having cooling constraints that are met with an airflow rate measured at a location are confirmed while information handling systems having cooling constraints that are not met with an airflow rate measured at a location are denied. At step 32, the use confirms orders for information handling systems that have their cooling constraints met. Once information handling systems are ordered, the user may dispose of the airflow measurement tool.

Figure 2:
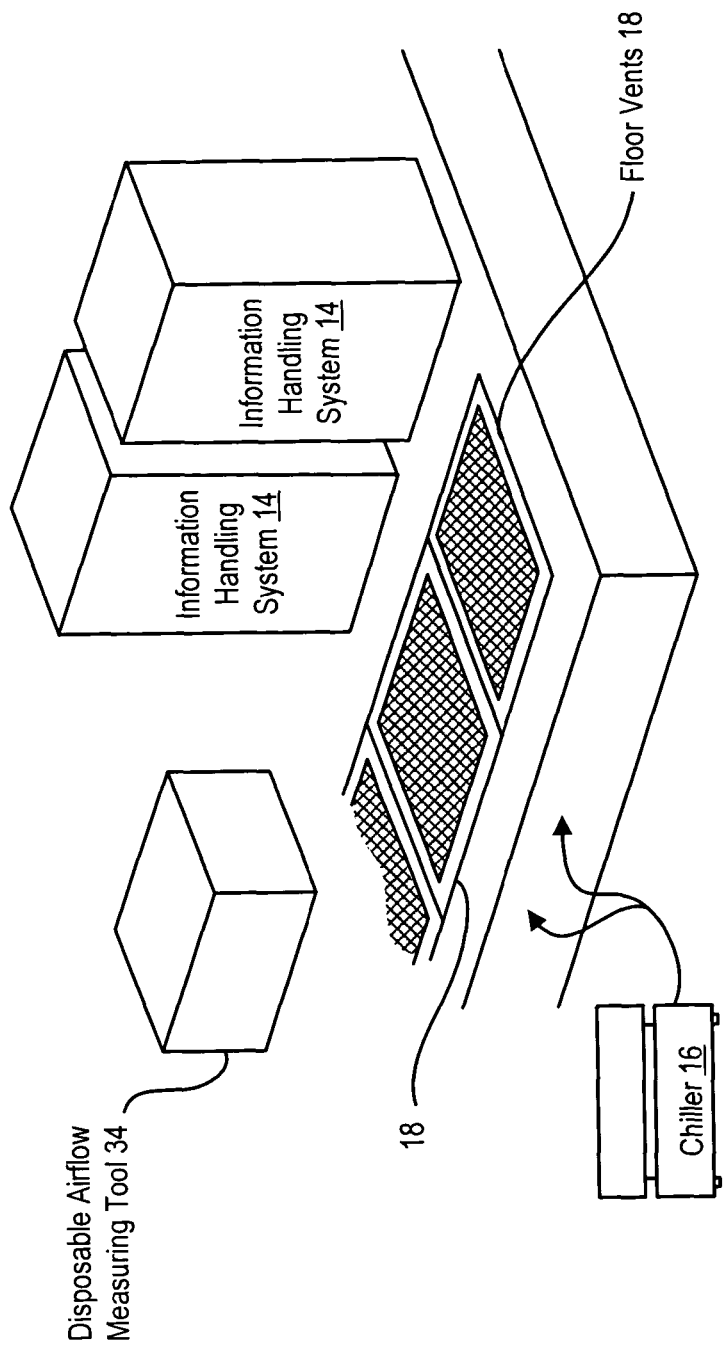
FIG. 2 depicts an information handling system data center with floor vents having airflow measured by a disposable tool.

Referring now to FIG. 2, a data center user location is depicted with floor vents 18 providing airflow from ducts in raised floor 20 towards information handling systems 14. Chiller 16 chills the air and flows the air with a minimal pressure increase through raised floor 20 and out floor vents 18. The airflow is intended to have sufficient velocity to travel the vertical height of information handling systems 14 so that an adequate supply of chilled air is available to cool heated components located in the upper portions information handling systems 14. However, slight disturbances to the airflow through raised floor 20 results in uneven distribution of airflow between different floor vents 18, potentially leading to one or more information handling system components receiving inadequate chilled air. A disposable airflow measuring tool 34 measures airflow from each of floor vents 18 proximate to each information handling system 14 to ensure that an adequate airflow rate exists at each floor vent for providing air to information handling systems 14. If a measured airflow rate is not adequate, upper portions of the proximate information handling system 14 may be made inactive or replaced with components that require less chilled air. In the instance where a user is purchasing information handling systems, adequate airflow rates for chilled air may be ensured before the purchase by placing disposable airflow measuring tool 34 over the relevant floor vents 18.

Figure 3:
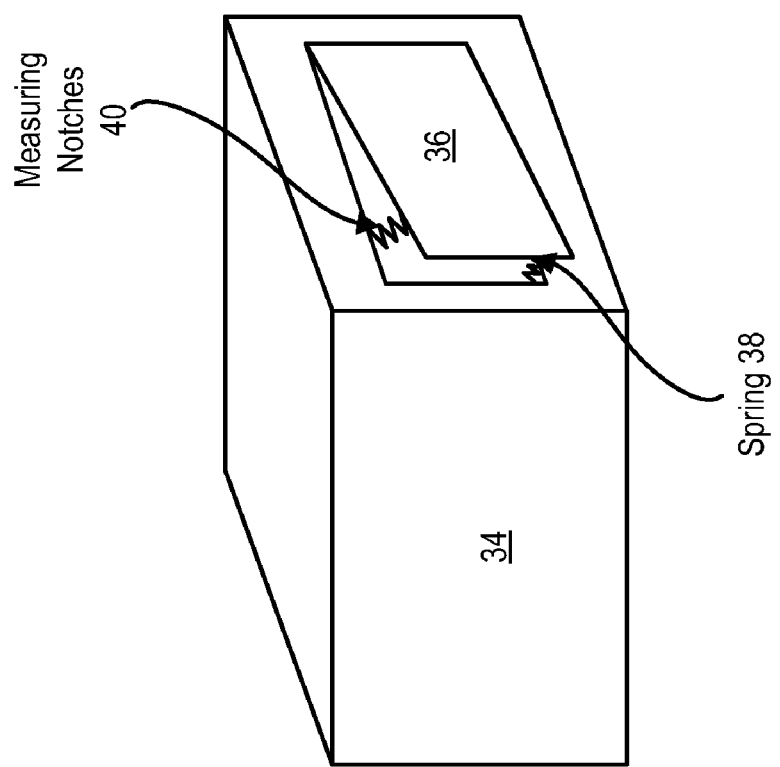
FIG. 3 depicts one embodiment of a disposable tool for measuring airflow rates from floor vents.

Referring now to FIG. 3, one embodiment of a disposable tool for measuring airflow rates from floor vents is depicted. Disposable airflow measuring tool 34 is a box sized to fit over a floor vent 18 so that the airflow from the floor vent enters through an open bottom surface. Tool 34 is a foldable cardboard or plastic box for ease of shipping from a manufacturer to a user that unfolds when needed. A slat 36 is cut from one side section to hinge from a closed position to varying degrees of an opened position. Slat 36 moves a greater amount for greater airflow rates and lesser amounts for less airflow rates. A restricting device 38, such as a friction bar or a spring, biases slat 36 to a closed position and allows slat 36 to open varying amounts for varying amounts of airflow rate. Measuring notches 40 on restricting device 38 provide an easy to read measurement of the degree to which slat 36 opens from the airflow entering through the bottom opening. The measurements provided from notches 40 are pre-calibrated to determine an airflow rate associated with a movement of slat 36, such as by determining the amount of movement that occurs when tool 34 is placed over an airflow having a known rate. The backpressure created by placement of tool 34 over a floor vent results in some reduction of airflow through the vent, which is considered in the calibration of the measurement markings. The effect of backpressure on the accuracy of airflow rate measurements is reduced by focusing the measurement on a range of values associated with information handling system cooling airflow rates. Alternatively, multiple measurements may be taken to compute an airflow rate value, such as by having slats 36 of varying restriction located on plural sides of tool 34.

Backpressure affects airflow rate measurement by adding resistance to the airflow through a floor tile so that air tends to flow towards floor vents that are not blocked by an airflow measuring tool. Assuming that the pressure differential above and below the floor vent is constant, $$dP\text{vent}=dP\text{vent}_0+dP\text{tool},$$

the unblocked pressure differential dPvent equals the blocked pressure differential of the vent plus the pressure differential added by the tool. In order to estimate a correction that compensates for the backpressure added by the tool, samples of measurements of airflow are taken at two or more airflow rates, $$dP\text{vent}=dP\text{vent}_1+dP\text{tool}_1=dP\text{vent}_2+dP\text{tool}_2,$$

where $$dP\text{vent}=k*(F)^2,$$

the differential pressure is a constant k times the measured flow squared, so that $$kF_0^2=P\text{tool}_1+kF_1^2=P\text{tool}_2+kF_2^2,$$

where Ptool is the pressure drop through the tool measured at the flow rate. The value of the constant k is given by solving the above equation:

$$k=(P\text{tool}_1-P\text{tool}_2)/(F_2^2-F_1^2).$$

Once k is known, the airflow rate compensated for backpressure is solved as the square root of the static pressure divided by k:

$$F=\sqrt{dP/k}$$

Figure 4:
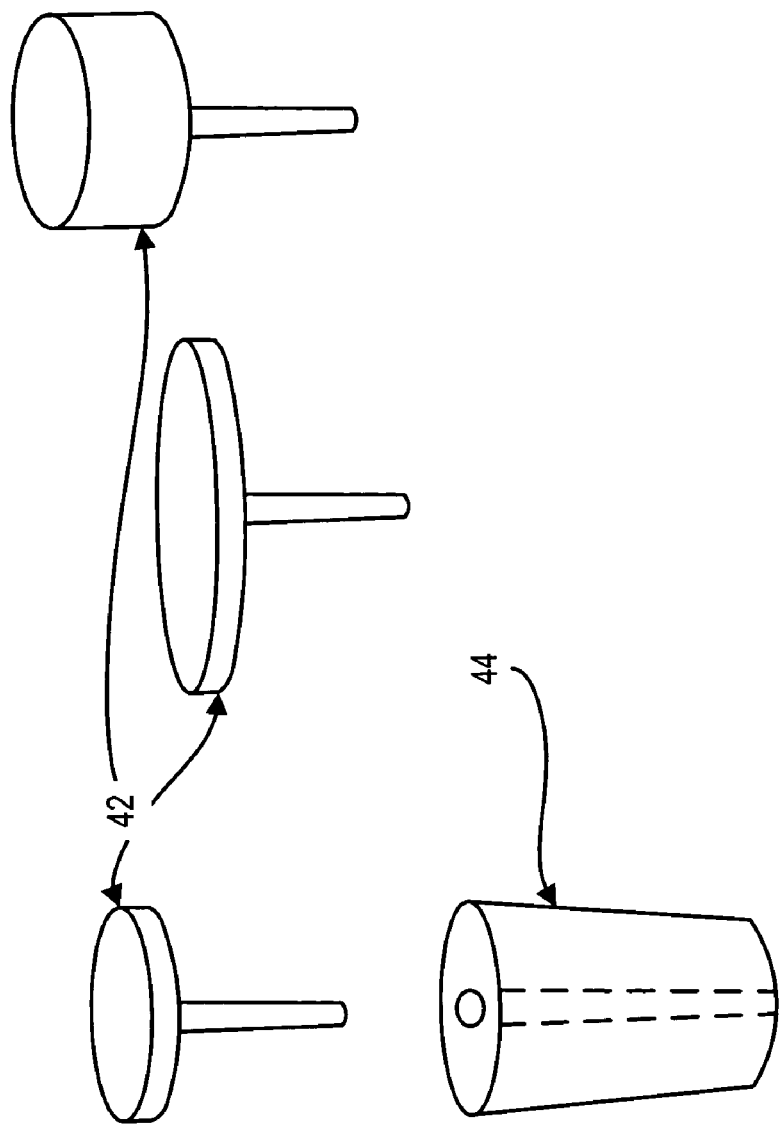
FIG. 4 depicts one embodiment of a disposable tool for measuring airflow rates from floor vents.

Referring now to FIG. 4, another embodiment of a disposable tool 34 for measuring airflow rates from floor vents is depicted. Weighted plunger devices 42 having varied weights and aerodynamic properties are placed in the airflow of a floor vent with the rate of the airflow related to the movement of the devices 42. The base of plunger device 42 rests in grates of the floor vent or in a support base 44 having that inserts in grates of varying size. Airflow rates are determined by the amount that a device 42 is lifted when placed in the airflow. Alternatively, airflow rates are determined within a range of values associated with greatest weight lifted by the airflow. In one embodiment, a user orders an information handling system for a predetermined location proximate to a floor vent. The manufacturer determines the minimum airflow rate that will meet the cooling constraints of the information handling system at the location and sends a weighted device to the user associated with the minimum rate so that the user may confirm the airflow from the floor vent meets the minimum before buying or installing the information handling system. Alternatively, the user takes plural measurements in different positions of the floor vent and inputs the measurements into a spreadsheet provided by the manufacturer to compute the airflow rate. For instance, spreadsheet instructions are downloaded from the manufacturer, run on a PDA device to accept the measurements at the user location and returned to the manufacturer to confirm that the measured airflow is adequate for the cooling constraints of selected information handling systems.

Although the present invention has been described in detail, it should be understood that various changes, substitutions and alterations can be made hereto without departing from the spirit and scope of the invention as defined by the appended claims.

What is claimed is:

1. A method for deploying information handling systems from a manufacturer location to a user location, the user location having chilled air distributed through one or more floor vents, the method comprising:

sending an airflow measuring tool from the manufacturer location to the user location;

measuring the flow rate of the chilled air through one or more floor vents with the airflow measuring tool;

comparing the measured flow rates with information handling system cooling requirements to determine positions for one or more selected information handling systems;

disposing of the airflow measuring tool at the user location; and shipping the selected information handling systems to the user location.

2. The method of claim 1 further comprising:
communicating the measured flow rates from the user location to the manufacturer location;
analyzing the measured flow rates at the manufacturer location; and
communicating information handling system cooling requirements associated with the measured flow rates from the manufacturer location to the user location.

3. The method of claim 1 wherein measuring the flow rate further comprises:
covering a floor vent with the airflow measuring tool; and
determining the degree of movement of a door covering an opening formed in the airflow measuring tool.

4. The method of claim 3 wherein the air-flow measuring tool comprises a cardboard box having an open bottom sized to cover the floor vent, the door formed in one side of the cardboard box.

5. The method of claim 4 wherein the airflow measuring tool further comprises a biasing device connecting the door to the cardboard box, the biasing device configured to allow door movement of predetermined amounts for airflow rates associated with information handling system cooling.

6. The method of claim 4 wherein sending an airflow measuring tool further comprises:
folding the cardboard box into a flat configuration at the manufacturer location;
shipping the cardboard box in the flat configuration to the user location; and
unfolding the cardboard box at the user location.

7. The method of claim 1 wherein measuring the flow rate further comprises:
directing at least some of the chilled air at a weighted device; and
determining a weighted device of plural weighted devices that the chilled air moves a predetermined distance.

8. The method of claim 1 further comprising:
calibrating a movable element of the airflow measuring tool with plural predetermined air-flow rates; and
marking plural positions of the movable element, each marked position associated with a predetermined air-flow rate.

9. The method of claim 8 wherein calibrating the movable element further comprises compensating for backpressure introduced by insertion of the movable element in an airflow.

10. A system for measuring airflow from floor vents disposed proximate to information handling systems for cooling the information handling systems with chilled air, the chilled air having airflow rates, the system comprising:
a housing having an opening sized to cover a floor vent to accept an airflow from the floor vent;
a measuring element associated with the housing and aligned to interact with the airflow, the measuring element moving varying distances in response to varying airflow rates; and
plural markings proximate the measuring element, each marking operable to determine a distance of movement of the measuring element, each marking associated with a predetermined airflow rate, the predetermined airflow rates falling within a range of airflow rates associated with airflow used in the cooling of information handling systems.

11. The system of claim 10 wherein the housing comprises a cardboard box.

12. The system of claim 10 wherein the housing comprises a plastic box.

13. The system of claim 10 wherein the housing has four sides and a top, the measuring element comprising a portion cut from a side of the housing and a restricting device, the restricting device allowing increased movement of the portion with increased airflow rates.

14. The system of claim 13 wherein the restricting device comprises a notched arm having plural notches, each notch associated with an airflow rate.

15. The system of claim 13 wherein the restricting device comprises a spring aligned to bias the housing side portion to close, the spring operable to allow the housing side portion to open an increased amount with an increased airflow rate.

16. The system of 10 further comprising instructions readable by an information handling system to:
accept measured airflow rates at the information handling system; and
analyze the measured airflow rates for compatibility with cooling requirements of one or more information handling systems.

* * * * *